United States Patent
Yang et al.

(10) Patent No.: US 6,818,475 B2
(45) Date of Patent: Nov. 16, 2004

(54) WAFER LEVEL PACKAGE AND THE PROCESS OF THE SAME

(76) Inventors: Wen-Kun Yang, No. 47, Lane 6, Ankang St., Hsinchu (TW); Eddy Mou, No. 6 Alley 1, Lane 139, Jungjeng W. Rd., Jubei City, Hsinchu (TW), 302

(*) Notice: Subject to any disclaimer, the term of this patent is extended or adjusted under 35 U.S.C. 154(b) by 0 days.

(21) Appl. No.: 10/640,539

(22) Filed: Aug. 13, 2003

(65) Prior Publication Data
US 2004/0032026 A1 Feb. 19, 2004

Related U.S. Application Data

(62) Division of application No. 10/029,764, filed on Oct. 22, 2001.

(51) Int. Cl.[7] .......................... H01L 21/44; H01L 21/48; H01L 21/50
(52) U.S. Cl. ..................... 438/113; 438/114; 438/110
(58) Field of Search ................ 438/113, 114, 438/110

(56) References Cited

U.S. PATENT DOCUMENTS 6,607,970 B1 * 8/2003 Wakabayashi .............. 438/462
6,656,758 B1 * 12/2003 Shinogi et al. .............. 438/33

* cited by examiner

Primary Examiner—Phat X. Cao
(74) Attorney, Agent, or Firm—Clement Cheng

(57) ABSTRACT

The present invention provides a method for forming wafer level package. The wafer level package comprising: a plurality of dies formed on the wafer; an I/O metal pad formed on the first surface of the wafer; and coating a photo sensitive polymer, on the first surface of the wafer, then a portion of the film is removed by laser. In the next step, coating a first photoresist on the second surface of the wafer. Forming a first conductive layer in the opening of the photo sensitive polyimide and then covering a I/O metal pad. Next, forming a seeding layer with copper on the top of the first conductive layer and on the photo sensitive polymer; and forming a second photoresist on the seeding layer to define the circuit pattern diagram. Then, forming a second conductive layer to the circuit pattern diagram located on the defined area of the second photoresist. Removing the second and the first photoresist and the seeding layer covered by the second photoresist, thus forming trenches between each of the packaging entity. Then, the filling material was filled into the trench and covered the circuit pattern diagram. The filling material comprises epoxy. Then, executing the grinding process to grind the second surface of the wafer to expose the filling material. Next, executing an opening step to expose a portion of the circuit pattern diagram to define an area that formed by the conductive convex block. Executing a solder screen printing step to form a solder area, then, reflowing this area to form a conductive bump.

12 Claims, 5 Drawing Sheets

WAFER LEVEL PACKAGE AND THE PROCESS OF THE SAME

CROSS-REFERENCE TO CO-PENDING APPLICATION

The subject matter of the present application is the divisional application Ser. No. 10/029,764, filed Oct. 22, 2001, which is also assigned to the assignee of the present invention.

FIELD OF THE INVENTION

This present invention relates to a semiconductor package, and more specifically, to a wafer level packaging technology and the method for forming the wafer level package.

BACKGROUND

In recent progress of integrated circuit device, since the chips are manufactured by a trend of high density and it also has a trend to make semiconductor devices have smaller size in order to contain more IC in the devices. IC designers are attempted to scale down the size of devices and increase chip integration in a much smaller space. Typically, the semiconductor devices need a protection to prevent the penetration of moisture or the damage caused by accidentally damage. Owing to this, the device structure needs to be packaged by some appropriate technology. In this technology, the semiconductor dies or chips are usually packaged in a plastic or ceramic package. The package of the chips must have the function to protect the chips from being damaged and to release the heat generated by the chips while they are under operation.

The previous packaging technology was mainly on the concept of the lead frame, using the lead leg as the I/O signal exchange channel. But now, under the highly integrated requirement of the I/O signal exchange, the traditional lead frame packaging can't totally meet the demand of this requirement. Under this consideration, the packaging needs to be smaller in volume in order to meet the highly integrated requirement. Highly integrated I/O packaging concept also brings the development and a breakthrough in the package technology. A method named as ball grid array (BGA) technology is a popular used method in recent year. Integrated circuit (IC) manufacture companies tend to adapt ball grid array (BGA) technology due to the lead leg used by BGA is a ball shaped leg instead of the slender leg used by the traditional lead frame technology. Another advantages of BGA also includes that the pitches (distance between balls) are smaller and is not easily deformed because of their ball shaped legs. The smaller distances between balls reveals that the signal transportation would also become quicker than the traditional lead frame technology The U.S. Pat. No. 5,629,835, proposed by Mahulikar, et. all, which entitled "METAL BALL GRID ARRAY PACKAGE WITH IMPROVED THERMAL CONDUCTIVITY" states a ball grid array packaging method. Another U.S. Pat. No. 5,239,198 discloses a packaging form, which consists a substrate using FR4 material to form the screen printing package.

The various integrated circuit packaging have been developed in recent years, however no matter what kind it is. Most of them adapt the following procedure in dividing the wafer: First, cutting the wafer into individual chips then proceed the packaging and testing step. However, in U.S. Pat. No. 5,323,051 "SEMICONDUCTOR WAFER LEVEL PACKAGING", it reveals a packaging step. The packaging step is conducted before cutting the wafers, it uses glass as adhesive material to seal the device in a hole. A covered hole is allowed to be the electric channel. The wafer level packaging is another manufacture trend for semiconductor package. One of the previous inventions is to form a plurality of dies on a surface of a semiconductor wafer. A glass is attached on the surface of the wafer having dies formed thereon. Then the other surface of the wafer (the surface without dies) is grinded to reduce the thickness of the wafer. This method is called back grinding. Then, the wafer is etched to separate from IC and expose a portion of the adhesive material. Another glass is attached to the wafer surface with dies by adhesive material. The next step is to form a thin film on the first glass, then etching the first glass and a portion of the adhesive material. This step is called the notch process. Thus forming a trench in the glass and adhesive material. In the next sep, Tin ball will be formed on the thin film in the subsequent process. The thin film made by solder will be patterned onto the surface of the first glass and the surface along the trench to provide an electric connection channel. Solder mask is then formed on the surface of the solder thin film surface and the surface of glass to expose the surface for which it is associated with the thin film. Tin ball is formed on the exposed solder thin film by traditional method. In the next step, the cutting procedure is conducted by etching the adhesive material in the trench to cut through the glass in order to separate the dies. The method mentioned above is complicate, it need the notch process and cutting the second glass to separate the dies. Besides, the cutting place would become a trench cliff, which is sharp for solder to attach on the cutting place and finally reduce the quality of the device in package process.

According to the reasons mentioned above, there is a need to provide a more simple and compact method to the wafer level packaging.

SUMMARY

It is an objective of the invention to provide a chip size packaging.

It is another objective of the invention to provide a wafer level package method.

It is yet another objective of the invention to provide a wafer level package method suit for the wafer level packaging test.

The wafer level package comprising: a plurality of dies forming on the wafer, and I/O metal pad forming on the first surface of the wafer.

Then, coating a photo sensitive polymer layer, for example, photo PI film is on the first surface of the wafer. Then, a portion of the photo polyimide film is removed by laser.

In the next step, coating a first photoresist on the second surface of the wafer, said second photoresist comprises a positive photoresist.

Forming a first conductive layer in the hole (opening) of the photo PI film and then covering a metal pad on the first conductive layer, wherein the first conductive layer comprises alloy with the Zn/Ni/Cu.

In the next step, forming a seeding layer with copper on the top of the first conductive layer and is on the photo sensitive polymer layer. Then, forming a second conductive layer on the circuit pattern diagram located on the defined area of the second photoresist. The second conductive layer comprises copper.

Removing the second and the first photoresist and the seeding layer covered by the second photoresist, thus forming trenches between each of the packaging entity.

Then, the filing material was filled into the trench and covering the circuit pattern diagram. The filling material comprises epoxy.

Then, executing the grinding process to grind the second surface of the wafer to expose the filling material. Next, executing an opening step to expose a portion of the circuit pattern diagram to define an area formed by the conductive convex block.

Executing a solder screen printing step to form a solder paste area, then reflowing this area to form a conductive convex block.

BRIEF DESCRIPTION OF THE DRAWING

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
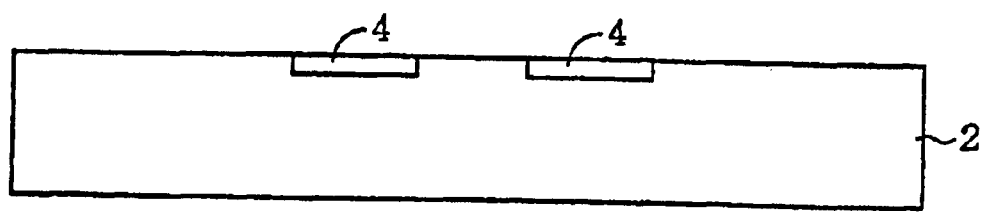
FIG. 1 indicates the cross-sectional diagram of a wafer with metal pad formed thereon.
Figure 2:
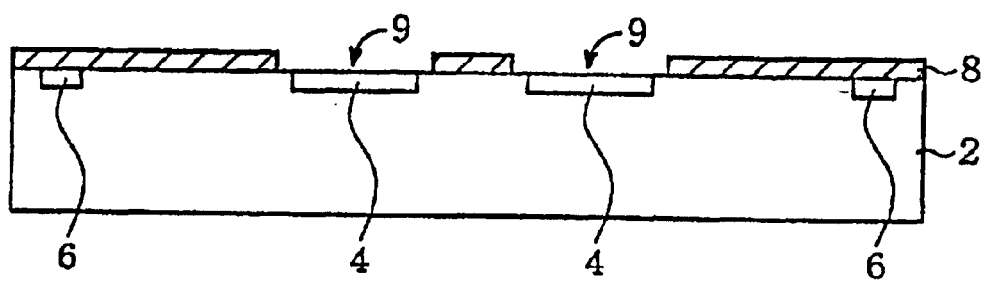
FIG. 2 indicates the cross-sectional diagram of a wafer with an opening opened thereon.

This invention discloses a wafer level package and a method for manufacturing the wafer level package. The detail procedure is shown below: first referring to FIG. 1 and FIG. 2, a surface (the first surface) of a wafer 2 has a metal pad for input and output signal (I/O metal pad) and a window 6 is also formed on the first of the wafer 2. The preferred material for photo sensitive polymer 8 could be photo PI or epoxy. A curing process by ultra violet radiation or heating process is conducted to enhance the structure of epoxy. Then, forming a plurality of opening 9 in the photo sensitive polymer, each opening area is opened associated with the metal pad 4. These metal pads 4 are thus exposed with no coverage. It should be noticed that the photo polyimide or epoxy are transparent material respect to laser, so the alignment mark on the scribble line will not be covered by the photo sensitive polymer. In other words, the label is visible to the alignment tools and can be easily seen in the next operation.

Another way of forming an opening 9 in order to expose the metal pad 4 can also be conducted as follows: Using a mask with some certain pattern to transfer the pattern onto the photoresist, and after the etching process to remove the photo polyimide orepoxy, this can also done to form the opening 9.

Figure 3:
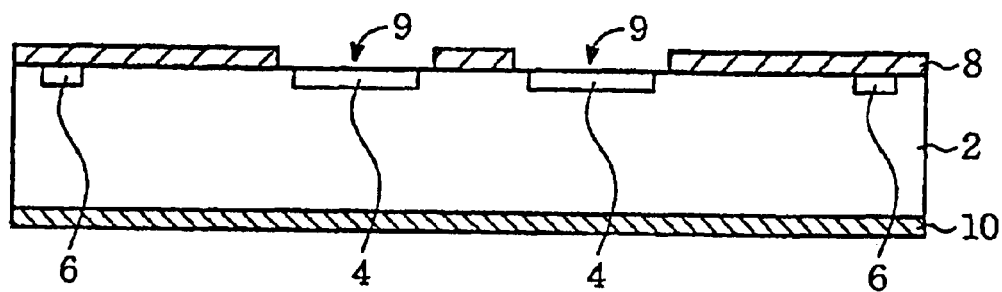
FIG. 3 indicates the cross-sectional diagram of a wafer with a positive photoresist formed on the back-side of the wafer.
Figure 4:
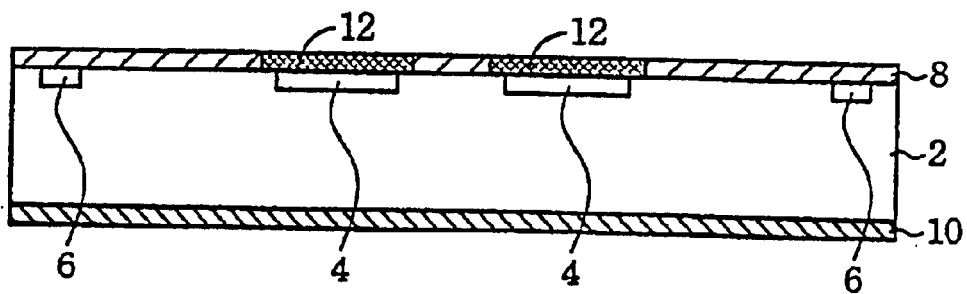
FIG. 4 indicates the cross-sectional diagram of a wafer with a electroplating pad wetting layer formed thereon.

Referring to FIG. 3, a photoresist 10 is coated on the second surface of the second surface of the wafer 2, and a first conductive layer 12 is filled into the opening 9, and the material for the first conductive layer 12 can be metal or alloy such as TiN/Ni/Cu. Typically, the first conductive layer 12 can be formed by electrical plating as shown in FIG. 4.

Figure 5:
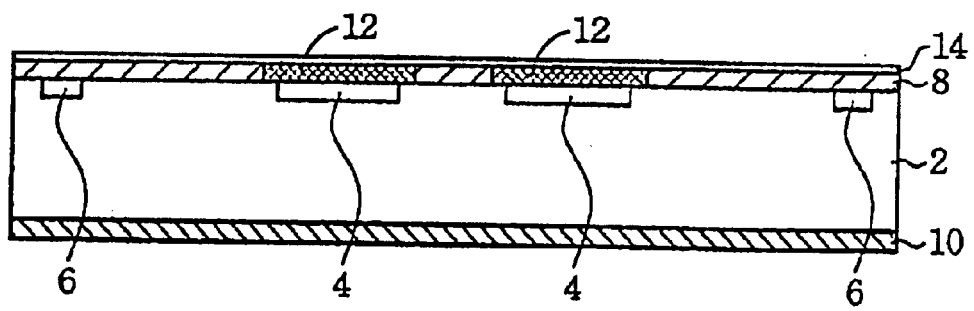
FIG. 5 indicates the cross-sectional diagram of a wafer with a non-electroplating copper seeding layer formed thereon.
Figure 6:
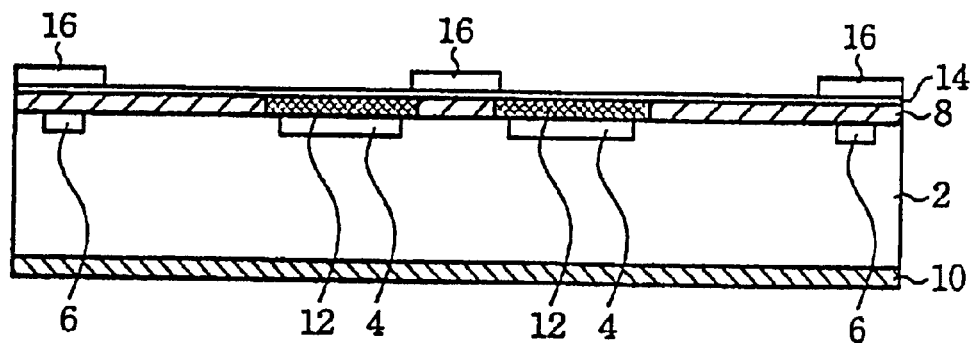
FIG. 6 indicates the cross-sectional diagram of a wafer with coating photoresist diagram thereon to define the circuit diagram.
Figure 7:
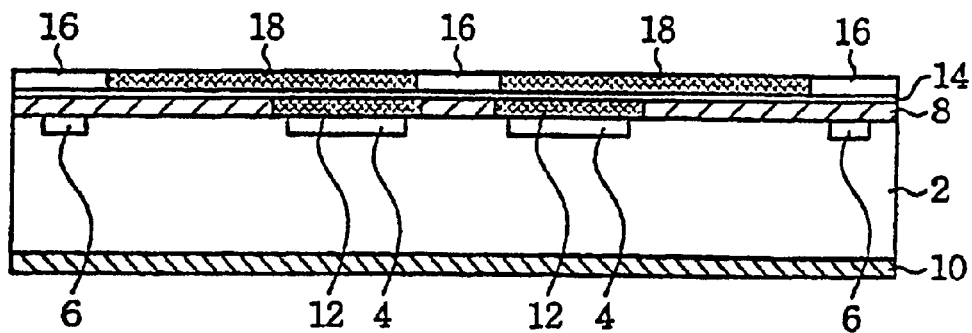
FIG. 7 indicates the cross-sectional diagram of a wafer with electroplating to form the copper layer.
Figure 8:
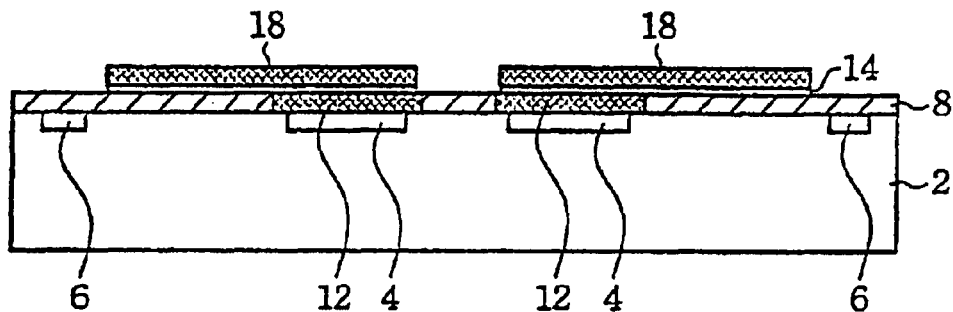
FIG. 8 indicates the cross-sectional diagram of a wafer with the situation of photoresist removed.

Next, referring to FIG. 5, a copper seeding layer 4 could be used by electroless Cu plating method to implant the copper seeding layer 14 on the surface of the photo sensitive layer 8 and the first conductive layer 12. Next photoreist pattern 16 is coated on the copper seeding layer 14 to define metal wire pattern. In FIG. 6, using the photoresist pattern 16 as a barrier, the metal (copper) wire 18 is formed on the portion of the area which is not cover by the photoresist pattern 16. The formation of the metal wire 18 can be conducted by using electroless plating method or other method to form the pattern the surface of the wafer 2, as shown in FIG. 7. Next, removing the photoresist pattern 16 and the copper seeding layer 14. During the removing step, although a very thin layer of copper layer 16 may be removed a little bit yet it would do little harm to the whole structure. In this way, the I/O metal pad 4 can be directed through first conductive layer 12 to form an electric connection with the metal copper seeding layer 18. This process is called re-distribution.

Figure 9:
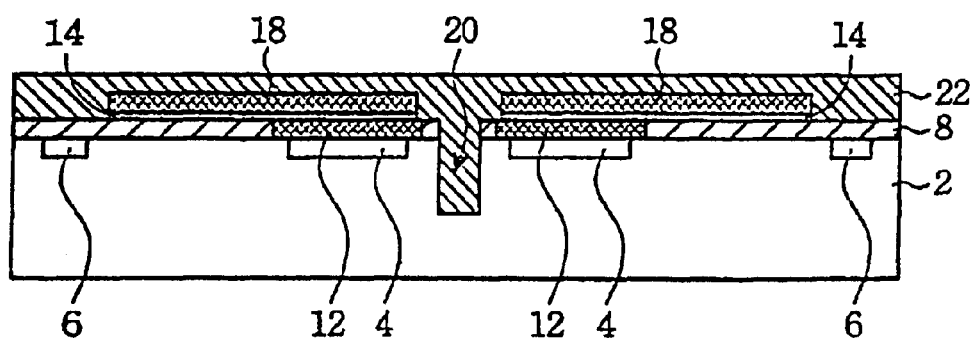
FIG. 9 indicates the cross-sectional diagram of a wafer with trench and filling material filled formed therein.
Figure 10:
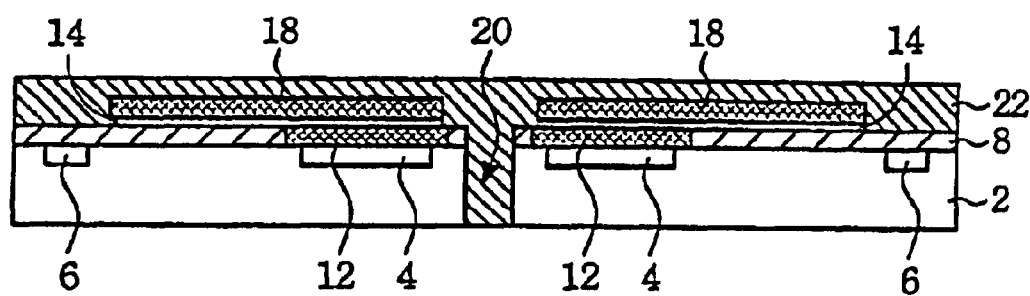
FIG. 10 indicates the cross-sectional diagram of a wafer with back-side grinding surface.

Referring to FIG. 9, etching the surface of the wafer 2 thus forming a trench 20 which can be used in the further manufacture step. A filling material 22 is filled in the trench 20 to cover the metal wire 18 for insulation and adhesion for packaging entity. The filling material 22 can be epoxy coated by vacuum coating process. The vacuum coating process can prevent the occurrence of bubble formed therein. The epoxy filling material 22 is filled in every packaging entity. In the next step, a curing process such as ultra violet radiation or heating process is conducted to enhance the epoxy structure. A back-side wafer grinding process is conducted in the next step to grind the second surface (the side without circuit lie above) till the bottom of the trench 20 in order to expose the filling material 22, as shown in FIG. 10.

Figure 11:
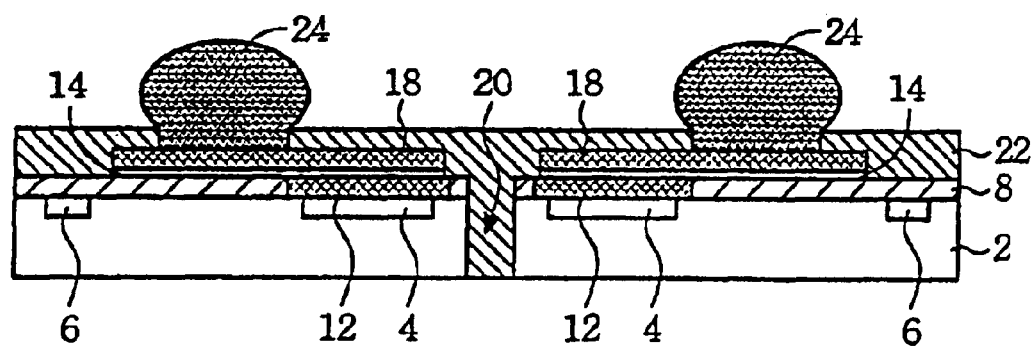
FIG. 11 indicates the cross-sectional diagram of a wafer with Tin ball formed therein.
Figure 12:
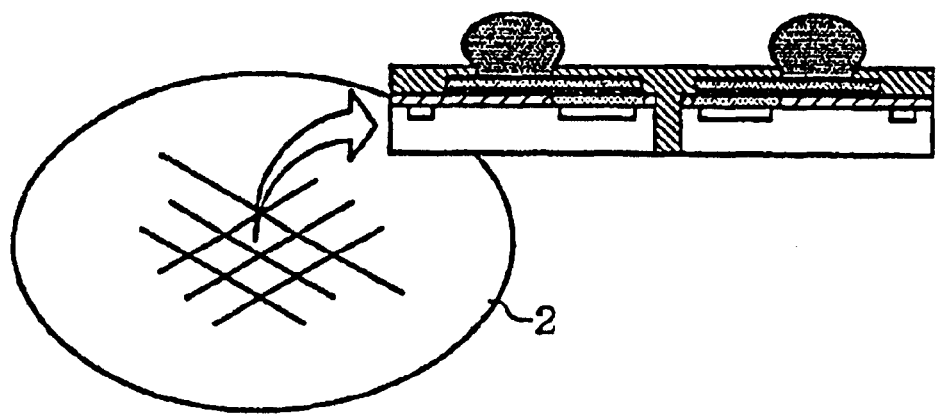
FIG. 12 indicates the cross-sectional diagram of a wafer after the wafer level package testing.
Figure 13:
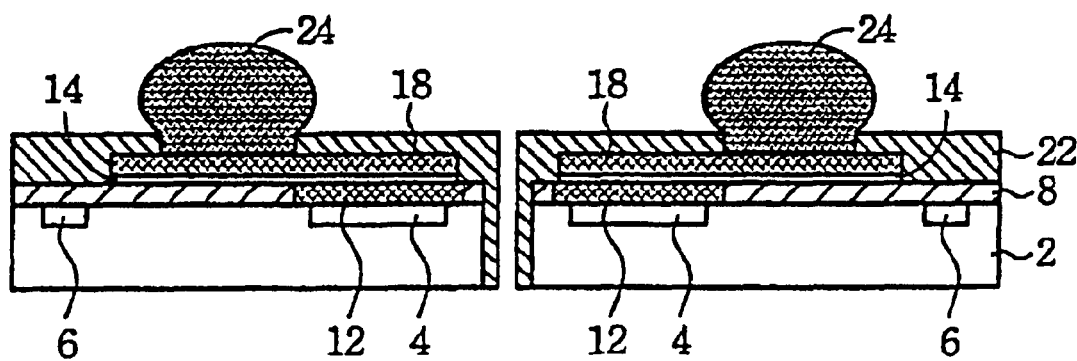
FIG. 13. indicates the cross-sectional diagram of a wafer after cutting (dividing) of the wafer level package.

Referring to FIG. 11, the next step is to define a bump area of solder ball. A portion area of the insulated filling material 22 will be removed and to expose the metal wire 18. The exposed area of the metal wire 18 is aimed to be the side location of the bump. The screen printing method is utilized to coat a layer of solder on the area and to reflow it by thermal process and turning a paste layer of solder into solder ball 24. The solder ball 24 is thus attached to the wafer. The formation of solder ball 24 can be conducted by the well known BGA technology and distributed as an array pattern along the side of a chip. An electric channel is thus constructed by the connection of Tin ball to metal wire 18. FIG. 12 is the diagram showing the wafer level package testing procedure. The wafer 2 is sent to the wafer level testing device for final testing. After the final testing, the wafer 2 is proceeding with a cutting (dividing) process to the filling material 22, thus producing a chip size package (CSP). This invention is simpler than the previous prior art and the advantage of the invention are the back side photoresist and the trench of the filling material 22 can be easily tested before cutting process is conducted. And after the cutting process, it is easily cut along the trench to separate each chip on the wafer 2 as shown in FIG. 13.

The wafer level package of this invention is shown in FIG. 11, which processes a plurality of chips on the wafer 2. A trench 20 formed therein to run through the wafer 2. The filling material 22 is filled in the trench. The I/O metal pad 4 is formed on the surface of the wafer 2. The photo sensitive polymer 8, such as photo polyimide or epoxy is formed on the wafer surface and exposed the I/O metal pad 4, the first conductive layer 12 lies within the photo sensitive polymer 8, the metal wire 18 lies above the surface of the filling material 22 and the first conductive layer 12. A protection layer is covered on the top of the electric channel, filling material and is also expose a portion of the electric channel and the conductive bump 24, which is on the top of the exposed metal wire 18.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modification and similar structure.

While the preferred embodiment of the invention has been illustrated and described, it will be appreciated that various changes can be made therein without departing from the spirit and scope of the invention.

What is claimed is:

1. A method of forming wafer level package for producing a chip size packaging, said method comprising:
   providing a plurality of dies on the wafer, wherein said wafer has I/O metal pads on a first surface of said wafer;
   coating a photo sensitive polymer on said first surface of said wafer;
   removing a portion area of said photo sensitive polymer to expose said metal pad;
   coating a photoresist on a second surface of said wafer;
   forming a first conductive layer in said photo sensitive polymer and covering said metal pad;
   forming a conductive seeding layer on the top of said first conductive layer and said photo sensitive polymer;
   patterning a photoresist on the top of said seeding layer to define a circuit pattern;
   forming a second conductive layer on said defined photoresist pattern to serve as the circuit distribution diagram;
   removing said photoresist pattern, and removing said conductive seeding layer covered by said photoresist pattern;
   forming trenches in between of the packaging entity;
   filling a filling material in said trenches and covering said circuit distribution diagrams;
   grinding said second surface of said wafer until said filling material is exposed;
   executing an opening step to expose a portion of said circuit distribution diagram to define a reserved area for a conductive bump;
   executing a solder screen printing step to form a layer of solder on said reserved area; and
   reflowing said solder to form said conductive bump.

2. The method according to claim 1, wherein after executing said reflowing process, further comprising a step of testing said wafers.

3. The method according to claim 2, wherein after executing said testing, further comprising a cutting process along said trenches.

4. The method according to claim 1, wherein the material of said photo sensitive polymer comprises photo polyimide.

5. The method according to claim 1, wherein the material of said photo sensitive polymer comprises epoxy.

6. The method according to claim 1, wherein said opening of said metal pad is formed by laser.

7. The method according to claim 1, wherein said first conductive layer comprises alloy with the composition of Zn/Ni/Cu.

8. The method according to claim 1, wherein the formation of said seeding layer is formed by using electroless copper plating.

9. The method according to claim 1, wherein said second conductive layer comprises copper.

10. The method according to claim 9, wherein said copper is formed by electroplating.

11. The method according to claim 1, wherein the material of said filling material comprises epoxy.

12. The method according to claim 1, further comprising a step to solidify said epoxy.

* * * * *